Figure 1:
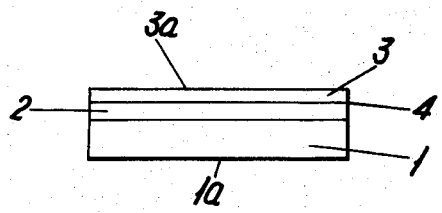

United States Patent [19]
Hart et al.

[11] 3,964,940
[45] June 22, 1976

[54] METHODS OF PRODUCING GALLIUM PHOSPHIDE YELLOW LIGHT EMITTING DIODES

[75] Inventors: Peter Brian Hart; Ralph Nicklin, both of Northampton, England

[73] Assignee: Plessey Handel und Investments A.G., London, England

[22] Filed: June 27, 1974

[21] Appl. No.: 483,810

Related U.S. Application Data

[63] Continuation-in-part of Ser. No. 287,175, Sept. 7, 1972, abandoned.

[30] Foreign Application Priority Data
Sept. 10, 1971  United Kingdom............... 42291/71

[52] U.S. Cl................................. 148/175; 156/612; 156/613; 148/187; 252/62.3 GA; 357/17; 357/63; 357/89; 357/90
[51] Int. Cl.²................. H01L 21/205; H01L 33/00
[58] Field of Search.................. 148/171, 175, 187; 252/62.3 GA; 357/17, 89, 63, 90; 313/108 D; 156/612, 613

[56] References Cited
UNITED STATES PATENTS

| | | | |
|---|---|---|---|
| 3,479,237 | 11/1969 | Bergh et al. | 148/187 X |
| 3,603,833 | 9/1971 | Logan et al. | 313/108 D |
| 3,634,872 | 1/1972 | Umeda | 357/17 |
| 3,646,406 | 2/1972 | Logan et al. | 357/17 |
| 3,687,744 | 8/1972 | Ogirima et al. | 148/175 |
| 3,716,405 | 2/1973 | Lim | 148/175 UX |
| 3,725,749 | 4/1973 | Groves et al. | 357/17 |

OTHER PUBLICATIONS
Logan et al., "Efficient Green Electroluminescent . . . GaP," Solid State Electronics, vol. 14, No. 1, Jan. 1971, pp. 55–70.

Dierschke et al., "Effect of Donor . . . Gallium Phosphide Diodes," J. Applied Physics, vol. 41, No. 1, Jan. 1970, pp. 321–328.

Tietjen et al., "Preparation . . $GaAs_{1-x}P_x$ Using Arsine and Phosphine," J. Electrochem. Soc., vol. 113, No. 7, July 1966, pp. 724–728.

Thomas et al., "Isoelectronic . . . Nitrogen in Gallium Phosphide," Physical Rev., vol. 150, No. 2, Oct. 14, 1966, pp. 680–689.

Dean et al., "Green Electroluminescence . . . Near Room Temperature," J. Applied Physics, vol. 38, No. 13, Dec. 1967, pp. 5332–5342.

*Primary Examiner*—L. Dewayne Rutledge
*Assistant Examiner*—W. G. Saba
*Attorney, Agent, or Firm*—Scrivener Parker Scrivener & Clarke

[57] ABSTRACT

A method of producing a gallium phosphide yellow light emitting diode which includes the steps of providing a single crystal gallium phosphide substrate; growing from a hydride vapour phase a single crystal layer of nitrogen doped gallium phosphide of the same conductivity type as the substrate on a surface of the substrate such that the nitrogen content of the layer is greater than $10^{19}$ atoms/cc, the actually nitrogen content determining the wavelength of the light that can be emitted; forming at least one p-n junction with the nitrogen doped gallium phosphide layer; and forming an electrically conductive contact on each side of the p-n junction.

12 Claims, 2 Drawing Figures

METHODS OF PRODUCING GALLIUM PHOSPHIDE YELLOW LIGHT EMITTING DIODES

This application is a continuation-in-part of application Ser. No. 287,175, filed Sept. 7, 1972, now abandoned.

The invention relates to methods of producing gallium phosphide yellow light emitting diodes.

It is known that red and green light emitting diodes can be produced in gallium phosphide (Gap), and it is possible to obtain diodes which emit light in the red region of the visible spectrum at 6,900 A by appropriate doping of the GaP with zinc and oxygen, and diodes which emit light in the green region of the visible spectrum at around 5,500 A by appropriate doping of the GaP with nitrogen. The red light emitting diodes have a high external quantum efficiency of up to 7% but the green light emitting diodes are in general much less efficient than the red light emitting diodes, external emission efficiencies of up to 0.6% being possible although typical efficiency figures that have actually been obtained are about 0.1%. However, because the sensitivity of the human eye is greater for green light than it is for red light, the light emission from the green light emitting diodes appears as bright as the light emission from the red light emitting diodes.

Known methods of producing efficient gallium phosphide red and green light emitting diodes basically consist of epitaxially growing from gallium solution one or more thin single crystal layers of gallium phosphide on a surfacae of a single crystal substrate, forming a p-n junction in the, or one of, the thin layers, and effecting the necessary doping to obtain either red or green light emitting diodes. It is usual for the substrate to be of gallium phosphide and be prepared by the well known Czochralski technique in a high pressure puller. For red light emitting diodes the usual method is to epitaxially grow an n-type layer onto a pulled n-type GaP substrate, and then to epitaxially grow a p-type layer containing the zinc-oxygen luminescent centre. Zinc diffusion into tellurium-oxygen doped material is an alternative technique for the formation of the p-n junction, but this, in general, results in red light emitting diodes of relatively low efficiency. The most efficient green light emitting diodes have been made from nitrogen doped gallium phosphide, using solution growth techniques to form both the n-type and p-type sides of the junction. Diodes have also been made by zinc diffusion into n-type nitrogen doped gallium phosphide grown from gallium. Individual diodes are made by dicing the GaP slice, usually after evaporation of metal contacts onto both the n and p-type sides of the slice.

Nitrogen doping is accomplished by exposing the gallium metal to ammonia vapour during the epitaxial growth process. In this way it is possible to obtain nitrogen doping levels of between $10^{18}$ and $10^{19}$ atoms/cc. in the GaP layer forming the p-n junction, the doping levels being estimated from the ratio of the nitrogen "A" line to the nitrogen $N-N_1$ pair lines under standardised cathodo-luminescence conditions at 77°K. using the data of Thomas and Hopfield, Phys. Rev. 150 (1966) pages 680 to 689. At room temperature the luminescence from such material is primarily from the A-line at 2.23 e.v. (5560 A) with a shoulder on the emission curve at 2.17 e.v. (5710A) from the "A-O" phonon line. The $N-N_1$ pair lines seen at 77°K would be at 2.11 e.v. (5870A) at room temperature, but in practice the pair line emission is very feeble. Thus the colour of the light emitted from this nitrogen doped GaP diode is green with some trace of yellow. Logan, White and Wiegmann (Solid State Electronics 1971 14 55–70) find that increasing the nitrogen concentration from $10^{17}$ atoms/cc to $8\times10^{18}$ atoms/cc results in more efficient diodes, and also in some colour changes, to give greenish yellow rather than green diodes. However, at nitrogen concentrations above $8\times10^{18}$ atoms/cc the diode efficiendy begins to fall again, and it is found that above a limiting concentration around $1\times10^{19}$ atoms/cc, diode quality material cannot be obtained by the solution growth process. It has been found difficult to produce efficient red or green light emitting diodes in material grown from the vapour phase mainly because of the difficulty of incorporating sufficient zinc-oxygen doping in GaP grown by vapour phase techniques, and because of the poor luminescent quality of the vapour grown material. This poor luminescence is believed to be due to the presence of centres in the material which act as sites for non-radiative recombination of holes and electrons.

Thus for both green and red light emitting GaP diodes only the solution growth techniques have been found satisfactory. This technique has, however, several disadvantages in that the pure gallium metal from which the GaP layer is grown is very expensive, and the relatively non-planar and featured surfaces which result from the process make it difficult to use conventional photolithographic techniques in the formation of the metal contacts for the diodes.

The invention provides a method of producing a gallium phosphide yellow light emitting diode which includes the steps of providing a single crystal gallium phosphide substrate; growing from a hydride vapour phase a single crystal layer of nitrogen doped gallium phosphide of the same conductivity type as the substrate on a surface of the substrate such that the nitrogen content of the layer is greater than $10^{19}$ atoms/cc, the actual nitrogen content determining the wavelength of the light that can be emitted; forming at least one p-n junction with the said layer; and forming an electrically conductive contact on each side of the p-n junction.

Figure 2:
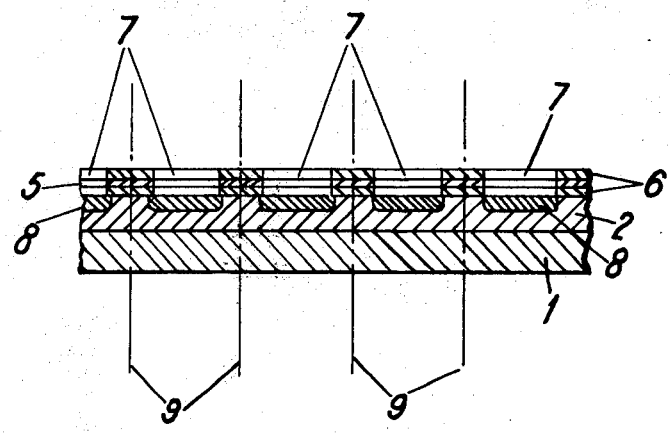

The foregoing and other features according to the invention will be better understood from the following description with reference to the accompanying drawings in which:

FIG. 1 diagrammatically illustrates the structure of a gallium phosphide light emitting diode; and FIG. 2 diagrammatically illustrates a step in the production of a gallium phosphide light emitting diode array by a method according to the invention.

It has been found that with a vapour phase growth technique it is possible to obtain much higher concentrations of nitrogen in the epitaxial gallium phosphide than are possible using the solution growth technique previously referred to. Concentrations of nitrogen that have been attained are $10^{19}$ to $10^{20}$ atoms/cc. as estimated from cathodoluminescence data at a temperature of 77°K using the data of Thomas and Hopfield previously referred to. These high concentrations of nitrogen have two beneficial results: firstly, it becomes possible to make relatively efficient light emitting diodes by a process which is more economical than, and more readily adapted to large scale production than, the solution growth process, and secondly the wavelength of the emission changes. It is thought that the efficiency of the diodes which is comparable with known light emitting diodes, results from the increased ratios of radiative/non-radiative centres in the material.

The changes in the wavelength of the emulsion which result from the high nitrogen concentrations occur because the intensity of the A-O phonon replica at room temperature increases relatively to that of the '$a$' line and then successively the relative intensities of the N-N$_1$ pair line and its phonon replica also increase. These changes result in a change in the colour of the light that is emitted at room temperature, i.e. from green through yellow to orange and then finally red. Fabrication of p-n junctions in the nitrogen doped gallium phosphide then produces diodes capable of emitting these colours.

A gallium phosphide light emitting diode is diagrammatically illustrated in FIG. 1 of the drawings and includes a single crystal substrate 1 of gallium phosphide, a single layer 2 of gallium phosphide of the same conductivity type as the substrate 1 which is formed on a surface of the substrate 1, and a layer 3 of gallium phosphide of opposite conductivity type to the layer 2 which is formed on or in a surface of the layer 2 and which forms a p-n junction 4 with the layer 2. An electrically conductive contact (not illustrated) is formed on each side of the p-n junction 4 i.e. on the surface 3$a$ of the layer 3 and the surface 1$a$ of the substrate 1, to facilitate the application of an electrical potential across the p-n junction 4 to effect forward biasing of the junction which results, in a suitably doped structure, in the emission of light of a particular wavelength. The wavelength of light that is emitted is, as was previously outlined, dependent upon the concentration of nitrogen.

In a method according to the invention for producing a yellow light emitting diode, the hydride process is used to grow the epitaxial layer 2 from a vapour phase on the surface of the substrate 1. The hydride process which is a process wherein the Group V element is transported as a hydride involves the use of Ga, H$_2$, PH$_3$ usually as a 5% by volume mixture in H$_2$ and HCl together with the dopant gases H$_2$S and NH$_3$; the H$_2$ is palladium diffused and the other reagents are of semiconductor grade.

The Ga contained within an enclosed boat is placed in the first zone of a three zone furnace that is used for the hydride process. The first zone is maintained at a temperature of 750°C during the hydride process thereby causing the Ga to be heated to this temperature and to produce gallium chloride vapour when HCl is passed over it.

The PH$_3$, NH$_3$ and H$_2$S are admitted into the second zone of the furnace during the hydride process where they mix with the gallium chloride vapour produced in the first zone. The second zone is maintained at a temperature of 950°C.

The substrate 1 which is positioned on a holder and contained within the third or growth zone of the furnace is preferably provided by a polished, single crystal n-type slice of gallium phosphide, pulled by the Czochralski process under pressure. In practice, the thickness of the substrate 1 is approximately 200 $\mu$m.

The substrate is, prior to the hydride process, etched for a period of 30 seconds in hot 1:1 by volume HCl/100 vol. H$_2$O$_2$ in order to provide a clean, smooth surface for facilitating the growing of the layer 2.

Thus, in practice, the substrate 1 is positioned on a substrate holder and placed in the third zone of the furnace after which the furnace is flushed with palladium diffused H$_2$.

The three zones of the furnace are then brought up to the required temperatures and the substrate is etched with 30cc/min HCl. The etching HCl is turned off after a period of 2 minutes, and the epitaxial growth of the layer 2 commences when the appropriate quantities of PH$_3$, HCl, H$_2$S and NH$_3$ are admitted into the furnace.

The H$_2$S can be synthesised if desired by passing the H$_2$ over sulphur in a low temperature zone (60°C) of a two zone furnace, and then reacting the H$_2$ and sulphur vapour in the other zone which would be maintained at a temperature of about 800°C. Typical flow rates of the gases are:

| | |
|---|---|
| 5% by volume PH$_3$ in H$_2$ | 10 ccs/min |
| HCl over Ga | 30 ccs/min |
| H$_2$ over sulphur | 25 ccs/min |
| NH$_3$ | 15 ccs/min |
| Diluting H$_2$ | 200 ccs/min |

These flow rates, after 60 minutes growth, give epitaxial layers of thickness 60 – 80$\mu$m in the growth temperature region of 840° to 880°C.

In a larger epitaxial furnace which is adapted for deposition on about 32 substrates in a single operation, larger gas flows than the ones given in the preceding paragraph are required. Typical flow rates of the gases in this instance are:

| | |
|---|---|
| 5% by volume PH$_3$ in H$_2$ | 400 ccs/min |
| HCl over Ga | 240 ccs/min |
| 50 ppm H$_2$S in H$_2$ | 25 ccs/min |
| NH$_3$ | 400 ccs/min |
| Diluting H$_2$ | 8,500 ccs/min |

Under these flow conditions, the temperature of the gallium source, mixing zone and deposition zone are 750°C, 950°C and 840° to 880°C respectively i.e. as in the example given above. Growth rates in this larger system are typically 20 to 30$\mu$m in a 60 minute deposition period.

The formation of the p-n junction 4 in the n-type layer 2 can be obtained by zinc diffusion which could be carried out in a two zone furnace, typical temperatures for the GaP and the Zn$_3$P$_2$ zones of the furnace being 950°C and 700°C respectively.

Thus in practice, the surface of the n-type layer 2 grown by the vapour phase process is first etched in hot aqua regia for 30 seconds and then transferred to a vitreous silica diffusion tube of the furnace together with 100 mgm of Zn$_3$P$_2$. The tube is then evacuated to a pressure of 5 × 10$^{-6}$ torr and sealed. The diffusion is then carried out at the above-temperatures for a period of 120 minutes. The temperature of the GaP and Zn$_3$P$_2$ zones are now lowered to 500°C and 300°C respectively and the heat treatment is carried out at these temperatures for a period of about 16 hours. This results in a diffusion depth i.e. the thickness of the layer 3, of approximately 5$\mu$m. In alternative methods, the diffusion can be effected with cadmium, magnesium, beryllium or other zinc sources.

The diffused layer on the substrate surface 1$a$ is removed, for example by a lapping operation, and the electrically conductive contacts are formed on the surfaces 3$a$ and 1$a$.

Alternatively, the p-n junction 4 can be formed epitaxially. This can be effected by epitaxially growing the layer 3 of FIG. 1 onto the surface of the n-type layer 2 by for example, a vapour phase process, and simultaneously doping the layer 3 during growth with a suitable p-type dopant, for example, zinc, to form a p-type epitaxial layer 3 and thereby the p-n junction 4. It is preferable that the epitaxial layer 3 is doped with nitrogen.

In practice, the semiconductive structure produced by this method is large enough to make many light emitting diodes, therefore, after the formation of the contacts for each of the diodes, the structure is cut into dice of the appropriate dimensions to produce the individual diodes.

The individual diodes are then mounted and bonded in a known manner onto a suitable header after which the dice are then normally encapsulated in an approximately hemispherical resin dome by any known technique. The resin gives mechanical protection and increases the total light output of the diode because of the improved matching with the refractive index of gallium phosphide. Appropriately absorbing dyes can be incorporated in the resin to improve the contrast between the ambient light and that emitted by the diode.

Typically, diodes made by the method outlined in preceding paragraphs have a nitrogen concentration of greater than $1 \times 10^{19}$ atoms/cc and emit radiation primarily in the yellow region of the visible spectrum around 5710 A, and have external quantum efficiencies in the range 0.05 to 0.1%. For diodes 0.36 mm$^2$ in cross section, efficiencies are fairly constant for drive currents between 20 mA and 100 mA, and at drive currents of 30 mA brightnesses are in the range 500 to 1000 ft. lamberts (1700 to 3400 cd/m$^2$).

When it is required to produce a light emitting diode array by the method outlined in preceding paragraphs, the nitrogen doped gallium phosphide layer 2 of the semiconductive structure produced after the vapour phase growth process is selectively diffused with a suitable acceptor to form an array of the p-type regions in the n-type layer 2. The selective diffusion is effected by suitably masking the surface of the layer 2 where diffusion is not required.

When zinc is utilised to effect the diffusion, the surface of the layer 2 can, as is illustrated on FIG. 2 of the drawings, be masked with a $SiO_2/Si_3N_4/SiO_2$ mask. Silicon nitride ($Si_3N_4$) is an effective barrier to zinc diffusion but it cannot be used alone for masking GaP since it cannot be differentially etched to produce the mask apertures. Thus, a $Si_3N_4$ layer 5 is sandwiched between layers 6 of silicon oxide ($SiO_2$) which can be differentially etched with respect to both $Si_3N_4$ and GaP in order to produce a mask with the apertures 7 therein. After the mask is formed the exposed areas of the layer 2 are diffused with the zinc in a manner previously outlined to form an array of p-type regions 8 in the n-type layer 2. Electrically conductive contacts are then formed in known manner for each of the diodes of the array.

The diode array that is produced can if desired be cut i.e. along a line, such as the lines 9, between each row and column of the array to produce individual diodes which can then be mounted and bonded onto a suitable header and encapsulated in an approximately hemispherical resin dome.

As previously stated, changes in the nitrogen content of the layer 2 will result in a change in the colour of the light emitted by the completed diode and in the device according to the invention nitrogen concentrations in the range $10^{19}$ to $10^{20}$ atoms/cc will result in the emission of light in the orange/yellow region of the visible spectrum.

It is to be understood that the foregoing description of specific examples of this invention is made by way of example only and is not to be considered as a limitation in its scope.

What is claimed is:

1. A method of producing a gallium phosphide yellow light emitting diode which includes the steps of providing a single crystal gallium phosphide substrate; growing from a hydride vapour phase a single crystal layer of nitrogen doped gallium phosphide of the same conductivity type as the substrate on a surface of the substrate such that the nitrogen content of the layer is greater than $10^{19}$ atoms/cc, the actual nitrogen content determining the wavelength of the light that can be emitted; forming at least one p-n junction with the said layer; and forming an electrically conductive contact on each side of the p-n junction.

2. A method as claimed in claim 1 wherein the growth of the nitrogen doped gallium phosphide layer from a hydride vapour phase is effected in a furnace having first, second and third zones and includes the steps of placing a source of gallium in the first zone of the furnace; positioning the substrate on a holder in the third zone of the furnace; flushing the furnace with palladiam diffused H$^2$; heating the three zones of the furnace to their respective operating temperatures; etching the substrate surface; passing HC$^1$ over the heated gallium to produce a required quantity of gallium chloride vapour which passes from the first zone to the second zone of the furnace; admitting appropriate quantities of the gases PH$_3$, NH$_3$ and H$_2$S into the second zone and causing these gases to be mixed with the gallium chloride vapour to produce a mixture which passes to the third zone of the furnace to provide a vapour phase therein; and epitaxially growing the nitrogen doped gallium phosphide layer on the substrate surface from the vapour phase.

3. A method as claimed in claim 2 wherein the etching of the substrate surface is effected with 30 ccs/min HCl for a period of 2 minutes.

4. A method as claimed in claim 2 wherein the first and second zones are respectively maintained at temperatures of 750° and 950°C, wherein the third zone is maintained at a temperature in the range 840° to 880°C, wherein the HCl is admitted to the first zone at a flow rate of 30 ccs/min, wherein the NH$_3$ and 5% by volume PH$_3$ in H$_2$ are admitted to the second zone respectively at flow rates 15 ccs/min and 10 ccs/min, wherein the H$_2$S is synthesised prior to admittance to the second zone by passing H$_2$ over sulphur at a flow rate of 25 ccs/min and wherein the thickness of the epitaxial layer which is achieved after 60 minutes growth is in the range 60 to 80μm.

5. A method as claimed in claim 4 wherein the provision of the H$_2$S gas includes the steps of passing H$_2$ over sulphur in one zone of a two zone furnace, the said one zone being maintained at a temperature of the order of 60°C; and reacting the H$_2$ and sulphur vapour in the other zone which is maintained at a temperature of the order of 800°C.

6. A method as claimed in claim 2 wherein the first and second zones are respectively maintained at temperatures of 750° and 950°C, wherein the third zone is maintained at a temperature in the range 840° to 880°C, wherein the HCl is admitted to the first zone at a flow rate of 240 ccs/min, wherein $NH_3$ and 5% by volume $PH_3$ in $H_2$ are both admitted to the second zone at a flow rate of 400 ccs/min, wherein 50 ppm $H_2S$ in $H_2$ is admitted to the second zone at a flow rate of 25 ccs/min and wherein the thickness of the epitaxial layer which is achieved after 60 minutes growth is in the range 20 to 30 $\mu$m.

7. A method as claimed in claim 1 wherein the nitrogen doped gallium phosphide layer is of n-type conductivity and wherein the said at least one p-n junction is formed in the n-type layer by diffusing the surface of the layer with a material selected from the group which comprises zinc, cadmium, magnesium and beryllium.

8. A method as claimed in claim 7 wherein the n-type layer includes a number of p-n junctions and wherein each of the p-n junctions are formed by zinc diffusion using a $SiO_2/Si_3N_4/SiO_2$ layered mask.

9. A method as claimed in claim 1 wherein the formation of a p-n junction with the said layer includes the steps of epitaxially growing another single crystal layer on the surface of the said layer and simultaneously doping the said another layer during growth with a dopant of the opposite conductivity type to the said layers.

10. A method as claimed in claim 9 wherein the said another layer is grown from a hydride vapour phase and is nitrogen doped.

11. A method as claimed in claim 1 wherein the nitrogen doped gallium phosphide layer includes a number of p-n junctions and wherein the method includes the step of cutting the structure into dice of the required dimensions to provide individual diodes.

12. A method as claimed in claim 11 which includes the steps of mounting and bonding each of the individual diodes onto a suitable header; and encapsulating the diode in a light transparent material.

* * * * *